United States Patent [19]
Biefeld et al.

[11] Patent Number: 6,071,109
[45] Date of Patent: Jun. 6, 2000

[54] METHOD OF MAKING ALINSB BY METAL-ORGANIC CHEMICAL VAPOR DEPOSITION

[75] Inventors: Robert M. Biefeld; Andrew A. Allerman; Kevin C. Baucom, all of Albuquerque, N. Mex.

[73] Assignee: Sandia Corporation, Albuquerque, N.Mex.

[21] Appl. No.: 09/256,819

[22] Filed: Feb. 24, 1999

[51] Int. Cl.$^7$ .................................................. C23C 16/18
[52] U.S. Cl. ............................... 425/255.34; 427/255.11; 117/104; 117/105
[58] Field of Search ......................... 427/255.34, 248.1, 427/255.11; 117/104, 105

[56] References Cited

U.S. PATENT DOCUMENTS

| | | | |
|---|---|---|---|
| 4,159,354 | 6/1979 | Milnes et al. | 427/74 |
| 4,620,206 | 10/1986 | Ohta et al. | 357/16 |
| 4,698,652 | 10/1987 | Umemoto et al. | 357/16 |
| 5,275,966 | 1/1994 | Gedridge, Jr. | 117/104 |
| 5,492,860 | 2/1996 | Ohkubo et al. | 117/89 |
| 5,772,757 | 6/1998 | Saito | 117/84 |

OTHER PUBLICATIONS

Biefeld, R.M., Allerman, A.A., and Baucom, K.C., "The Growth of AlInSb by Metal–Organic Chemical Vapor Deposition," J. of Electronic Materials, 1998, 27, L43–L46.

Biefeld, R.M., Allerman, A.A., and Pelczynski, M.W., "Growth of n– and p–type Al(As)Sb by Metalorganic Chemical Vapor Deposition," Appl. Phys. Letters, 1996, 68(7), 932–934.

Biefeld, R. M., Hills, C. R., and Lee, S. R., "Strain Relief in Compositionally Graded $InAs_xSb_{1-x}$ Buffer Layers and $InAs_xSb_{1-x}$ InSb Strained–layer Superlattices Grown by MOCVD," J. of Crystal Growth, 1988, 91, 515–526.

Brieland, W.G., and Evans, G.H., "Design and Verification of Nearly Ideal Flow and Heat Transfer in a Rotating Disk Chemical Vapor Deposition Reactor," J. Electrochem. Soc., 1991, 138(6), 1806–1816.

Jones, A.C., "Metalorganic Precursors for Vapour Phase Epitaxy," J. of Crystal Growth, 1993, 129, 728–773.

Leroux, M., Tromson–Carli, A., Bigard, P., and Verie, C., "Growth of AlSb on Insulating Substrates by Metal Organics Chemical Vapour Deposition," 1980, 48, 367–378.

Saker, M.K., Whittaker, D.M., Skolnick, M.S., McConville, C.F., Whitehouse, C.R., Barnett, S.J. Pitt, A.D., Cullis, A.G., and Williams, G.M., "Demonstration of Quantum Confinement in $InSb–In_{1-x}Al_xSb$ Multiquantum Wells Using Photoluminescence Spectroscopy," Appl Phys. Letters, 1994, 65(9), 1118–1120.

Wang, C.A., Finn, M.C., Salim, S., Jensen, K.F., Jones, A.C., "Tritertiarybutylaluminum as an Organometallic Source for Epitaxial Growth of AlGaSb," Appl. Phys. Letters, 1995, 67(10), 1384–1386.

Whitehouse, C.R., McConville, C.F., Williams, G.M., Cullis, A.G., Barnett, S.J., Saker, M.K., Skolnick, M.S., and Pitt, A.D., "MBE Growth of Strained–Layer InSb/InAlSb Structures," 1990, Mat. Res. Soc. Symp. Proc., 198, 283–288.

*Primary Examiner*—Shrive Beck
*Assistant Examiner*—Bret Chen
*Attorney, Agent, or Firm*—Elmer A. Klavetter

[57] ABSTRACT

A method for producing aluminum-indium-antimony materials by metal-organic chemical vapor deposition (MOCVD). This invention provides a method of producing $Al_xIn_{1-x}Sb$ crystalline materials by MOCVD wherein an Al source material, an In source material and an Sb source material are supplied as a gas to a heated substrate in a chamber, said Al source material, In source material, and Sb source material decomposing at least partially below 525° C. to produce $Al_xIn_{1-x}Sb$ crystalline materials wherein x is greater than 0.002 and less than one.

15 Claims, 3 Drawing Sheets

METHOD OF MAKING AlInSb BY METAL-ORGANIC CHEMICAL VAPOR DEPOSITION

This invention was made with Government support under Contract No. DE-AC04-94AL85000 awarded by the Department of Energy. The Government has certain rights in the invention.

BACKGROUND OF THE INVENTION

The invention relates to a method for producing III-V materials by metal-organic chemical vapor deposition (MOCVD) and, more particularly, to a method for producing aluminum-indium-antimony materials by MOCVD.

Metal-organic chemical vapor deposition (MOCVD), alternatively called organometallic vapor-phase epitaxy (OMVPE) or other combinations of these terms such as metal-organic vapor phase epitaxy (MOVPE), is an epitaxial crystal growth technique yielding high-quality low-dimensional structures for semiconductor devices, both optoelectronic and electronic. The growth of semiconductor III-V compounds by MOCVD involves introducing metered amounts of the group III alkyls and the group V hydrides as gases into a reactor that contains a heated susceptor. The growth takes place at the susceptor on a substrate. The reactor system may have various configurations including a reactor chamber operated under a vacuum with a rotating susceptor (Breiland W. G. and Evans, G. H., J. Electrochem. Soc., 1991, 138(6), 1806–1816; incorporated by reference herein) or a quartz reactor chamber operated at atmospheric pressure with a stationary susceptor (Biefeld R. M., Hills, C. R., and Lee, S. R., J. of Crystal Growth, 1988, 91, 515–526; incorporated by reference herein).

AlInSb materials are of interest for their potential applications in a variety of optoelectronic and electronic devices such as infrared detectors, resonant tunneling diodes, magnetic field sensors, and laser diodes as well as a variety of other semiconductor heterostructures. In particular, these materials can be used as confinement materials in 2–6 $\mu$m, mid-infrared optoelectronic and heterojunction devices. Emitters in this wavelength range have potential uses as chemical monitors and in infrared countermeasures.

Devices using AlInSb have been successfully prepared by molecular beam epitaxy (MBE). For example, Whitehouse et al. (Whitehouse, C. R., McConville, C. F., Williams, G. M., Cullis, A. G., Barnett, S. J., Saker, M. K., Skolnick, M. S., and Pitt, A. D., Mat. Res. Soc. Symp. Proc., 1990, 198, 283–288) describe the growth of high-quality InSb/InAlSb structures by MBE on InSb substrates. Saker et al. (Saker, M. K., Whittaker, D. M., Skolnick, M. S., McConville, C. F., Whitehouse, C. R., Barnett, S. J., Pitt, A. D., Cullis, A. G., and Williams, G. M., Appl. Phys. Lett., 1994, 65(9), 1118–1120) discuss quantum confinement in InSb-$Al_xIn_{1-x}$Sb (0.08<x<0.30) structures grown on InSb (100) substrates using MBE. MOCVD is preferred in some applications over MBE, generally a more expensive technique, when large-scale production is desired and for optoelectronic devices such as light-emitting diodes and lasers. MOCVD has potential advantages that include the capability to rapidly vary the composition over wide ranges, good layer growth control, and simpler handling due to the standard- or low-pressure conditions. The technique is attractive in its ability to grow uniform layers, its low background doping density and sharp interfaces, and its relative simplicity compared to other growth methods for commercial applications.

Several investigators have grown AlSb by MOCVD, although little mention has been made regarding purity. Leroux et al. (Leroux, M., Tronson-Carli, A., Gibart, P., and Verie, C., J. of Crystal Growth, 1980, 48, 367–378) prepared AlSb on $SiO_2$ substrates using MOCVD, noting that growth methods like hydride VPE or liquid phase epitaxy are difficult to implement for aluminum compounds because gaseous aluminum chloride etches the quartz tubes and molten aluminum etches common crucibles. MOCVD was found to be a reliable method to grow thin films of AlSb, avoiding problems of aluminum reactivity and inhomogeneity that occur on growth from the melt.

Biefeld et al. (Biefeld, R. M., Allerman, A. A., and Pelczynski, M. W., Appl. Phys. Lett., 1996, 68(7), 932–934) have also grown high-quality AlSb by MOCVD with low carbon concentration. Biefeld et al. also demonstrated the growth of low carbon $AlAs_{0.16}Sb_{0.84}$ by MOCVD. Biefeld et al. also note that growing aluminum compounds by MOCVD often fail because the use of conventional precursors, such as trimethylaluminum and trimethylantimony (TMSb) or triethylantimony (TESb) has resulted in material with carbon and oxygen concentrations exceeding $1\times10^{19}$ $cm^{-3}$, with rough surface morphologies. Known to those skilled in the art is that Al-containing materials prepared using MOCVD tend to have larger concentrations of both O and C impurities when compared to the Ga-containing analogue. The presence of these impurities in Al-containing semiconductors is due to the strength of the bond between Al and O or C when compared to the bond strength of Al to P, As, or Sb. Biefeld et al. report significant reductions of C and O incorporation by using trimethylaminealane and triethylantimony.

Jones (Jones, A. C., J. of Crystal Growth, 1993, 129, 745) attempted the growth of compounds incorporating both In and Al, in the form of trimethylaminealane (TMAAl), but severe premature reactions occurred, preventing or hindering growth of the desired crystalline material. Jones attempted the growth of AlInAs materials with TMAAl and found that premature reactions occurred, even at reduced pressures, when a high concentration of Al, in the form of TMAAl, was present in combination with $(CH_3)$In and $AsH_3$, which precluded successful AlInAs growth.

Useful would be a method to prepare AlInSb by MOCVD to obtain a high-quality material that can be incorporated in optoelectronic and electronic devices. Because of the difficulties mentioned herein in preparing AlInSb materials by MOCVD, the prior art provides no solutions to this unmet need.

SUMMARY OF THE INVENTION

According to the present invention, a method of producing $Al_xIn_{1-x}$Sb crystalline materials by metal-organic chemical vapor deposition is provided wherein an Al source material, an In source material and an Sb source material are supplied as a gas to a heated substrate in a chamber, said source materials decomposing at least partially below 525° C. to produce $Al_xIn_{1-x}$Sb crystalline materials wherein x is greater than 0.002 and less than one. Preferred is a method of producing $Al_xIn_{1-x}$Sb crystalline materials wherein the Al source material is tritertiarybutylaluminum, the In source material is trimethylindium, and the Sb source material is selected from the group consisting of triethylantimony and trimethylantimony.

According to the present invention, the temperature of the chamber is preferred to be greater than approximately 435° C. and less than approximately 525° C.

Importantly, to produce $Al_xIn_{1-x}$Sb crystalline materials, the ratio of the tritertiarybutylaluminum mole fraction to the sum of the mole fractions of tritertiarybutylaluminum and trimethylindium is greater than approximately 0.62. According to the method of the present invention, the produced $Al_xIn_{1-x}Sb$ crystalline materials have hole concentrations less than approximately $2 \times 10^{17}$ cm$^{-3}$ and mobilities of greater than approximately 24 cm$^2$/Vs.

DETAILED DESCRIPTION OF THE INVENTION

Figure 1:
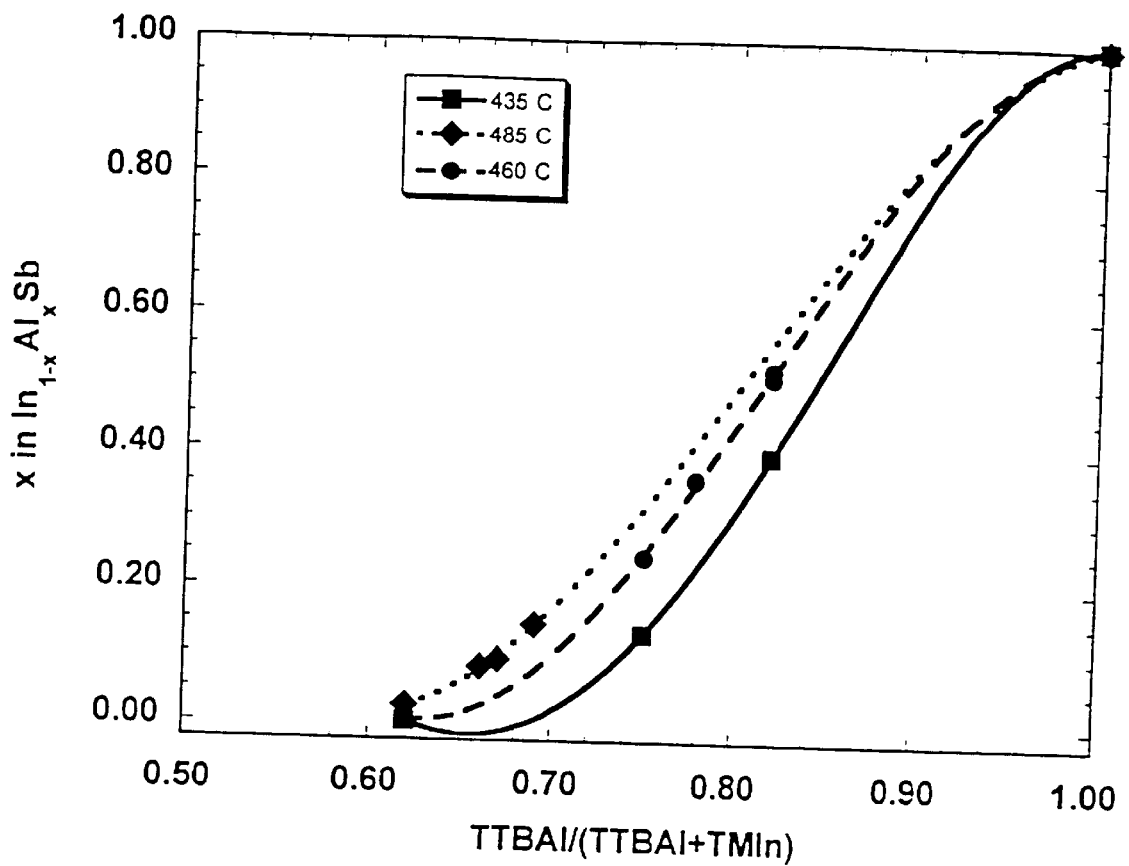
FIG. 1 shows the variation of Al incorporation into $Al_xIn_{1-x}Sb$.

For large-scale production of certain crystalline materials used in optoelectronic and electronic devices, and in particular for the production of light-emitting diodes and lasers, metal-organic chemical vapor deposition (MOCVD) is preferred over molecular beam epitaxy. MOCVD processing is well known to those skilled in the art for depositing compound semiconductor films on a substrate. MOCVD has potential advantages over molecular beam epitaxy methods that include the capability to more easily vary composition and simpler handling due to the standard- or low-pressure conditions.

In preparing crystalline materials in an MOCVD reactor system, the compounds containing the elemental materials are injected as a gas in metered amounts into a reactor chamber containing a heated substrate. Growth of the crystalline material occurs at the substrate surface. The reactor may be operated under various pressure and temperature conditions, with the material flow rates, pressure and temperature set to mitigate unwanted reactions and control crystal growth. The temperature must be high enough to decompose the source compounds to release the elemental materials desired in the product but be lower than the melting temperatures of the product material. The pressure and flow rate chosen controls, in part, the concentration of the gases at the surface of the substrate and thus the growth rate.

In the production of AlInSb materials by MOCVD, proper selection of reactants and operating conditions is necessary if the AlInSb films are to be produced and to ensure that high-quality materials are produced. In preparing aluminum-indium-antimony (AlInSb) materials using MOCVD, one requirement is that the aluminum, indium, and antimony sources must decompose, at least partially, below approximately 525° C., which is the melting temperature of InSb.

The organometallic sources are also required to have a vapor pressure sufficiently high to produce reasonably high growth rates. For example, the low vapor pressure of triethylaluminum (TEAl) (0.05 Torr at 30° C.) results in low growth rates that make the use impractical. Wang et al. (Wang, C. A., Finn, M. C., Salim, S., Jensen, K. F., and Jones, A. C., Appl. Phys. Lett., 1995, 6(10), 1384–1386) describe an alternative source, tritertiarybutylaluminum (TTBAl) to grow AlGaSb epilayers in the temperature range 300–450° C. with very low carbon levels; known is the art however is that Al-containing materials tend to have larger concentrations of both O and C impurities compared to the Ga-containing analogue.

The organometallic source compounds must also be transportable to the substrate in the MOCVD reactor in the presence of the other reactants. By transportable, we mean that, for example, the Al source must be transported to the substrate in the reactor under the conditions of reaction before completely reacting or decomposing in the presence of the In and Sb sources. The novel Al source, TMAAl, was found to produce reactions that prevented the successful growth of AlInSb compounds.

Another difficulty found using conventional methyl-based precursors such as trimethylaluminum, TMAl, was that the surface morphology degrades because of increased oxygen incorporation associated with the high Al concentration. A more serious problem is carbon (C), a p-type impurity. Because of the strong Al-C bond, the material layers can have a very high level of carbon contamination, with hole concentrations so high that the materials can not be used for many applications. Growths of AlInSb attempted using TMAl at low temperatures (<525° C.) were unsuccessful due to the lack of decomposition of TMAl below this temperature.

According to the present invention, a method of growing $Al_xIn_{1-x}Sb$ (0<x<1) by MOCVD is described in which an Al source material, an In source material and an Sb source material are supplied as a gas to a heated substrate in a chamber. All source materials must decompose at least partially below approximately 525° C. Additionally, the source materials preferably have a vapor pressure greater than approximately 0.1 Torr at a temperature greater than –10° C. Additionally, the source materials chosen cannot react completely prior to being transported to the substrate surface. More particularly, the source materials used in the present invention are tritertiarybutylaluminum (TTBAl), trimethylindium (TMIn), and triethylantimony (TESb). Conventional organometallic sources of Al, such as TMAl and TEAl were found to not be successful in producing the desired AlInSb materials. TTBAl partly decomposes at approximately 435° C.; TMIn decomposes at approximately 200° C.; TESb starts to decompose at approximately 400° C. TTBAl has a vapor pressure of approximately 0.5 torr at 20° C.; TMIn has a vapor pressure of approximately 1.7 torr at 20° C.; TESb has a vapor pressure of approximately 2.9 torr at 20° C.

Substrates include semi-insulating GaAs and n-type InSb. The source materials are transported via a carrier gas. The carrier gas is typically hydrogen but can be other gases, such as nitrogen, that do not produce unwanted reactions.

The use of a stable Al source material is particularly important for the successful growth of AlInSb materials. TTBAl has the necessary physical properties to meet the stated requirements for decomposition temperature and vapor pressure and is stable in the presence of the In source material, TMIn. The stability is because of the similar bond strength of the methyl group and the tritertiarybutyl group to the group III metals, In and Al.

TBAl, TMIn and TESb were used in a MOCVD process to produce high-quality $Al_xIn_{1-x}Sb$ materials according to the present invention (Biefeld, R. M., Allerman, A. A., and Baucom, K. C., Journal of Electronic Materials, 1998,27, L43-L46; incorporated herein by reference). The materials were successfully produced in both a rotating disk reactor as well as a quartz tube reactor with a stationary substrate. Both GaAs and n-type InSb substrates were utilized. Growth pressures of approximately 200 torr were used, although pressures as low as 80 torr were examined. Under the reaction conditions chosen with the TTBAl, TMIn, and TESb source materials, the $Al_xIn_{1-x}Sb$ materials were produced for mole fractions of Al ranging from 0.002 to 1. FIG. 1 illustrates the variation of Al incorporation into $Al_xIn_{1-x}Sb$ as a function of the TTBAl/(TTBAl+TMIn) vapor phase ratio. The Al composition, x, increases from 0.002 at a TTBAl/(TTBAl+TMIn) ratio of 0.62 to x=0.52 for a ratio of 0.82. These results were obtained for V/III ratios between 1.6 and 3.0 and temperatures between 435 and 485° C. Experiments were performed using V/III ratios as high as 7.2 to produce the $Al_xIn_{1-x}Sb$ materials. The corresponding trimethylindium vapor phrase fraction ranges from 0.001 to 0.11. The Al composition was determined from x-ray diffraction using the (004) and (335) reflections to correct for residual strain in the layers. As illustrated in FIG. 1, the Al distribution coefficient is much less than one. For a TTBAI/(TTBAI+TMIn) ratio of 0.75, the Al composition varied from 0.13 to 0.25 for temperatures of 435 to 460° C.

Although experiments were performed with the TTBAI/(TTBAI+TMIn) vapor phase ratio varied from 0.26 to 0.82, importantly, no Al was incorporated into the solid until a vapor phase fraction of 0.62 was reached at any of the temperatures used in this study. This drastic offset in the solid-vapor distribution of Al indicates the probable existence of depletion reactions in the vapor phase between TTBAl and either TMIn or TESb. Previous work indicates that TTBAl and TESb do form an adduct that is a low-vapor-pressure solid at room temperature. This is similar to the behavior that was observed for the growth of $Al_xG_{1-x}Sb$ using TTBAI and either TESb or trimethylantimony (TMSb). No reaction product could be observed when TTBAI and TMIn were mixed in a quartz tube at room temperature. Reaction products in the form of a white solid were observed when TTBAI and either TESb or TMSb were mixed in the same quartz tube. Because of the similar characteristics of TESb and TMSb, TMSb can also be likely used with TTBAI and TMIn to produce the desired $Al_xIn_{1-x}Sb$ materials.

Figure 2:
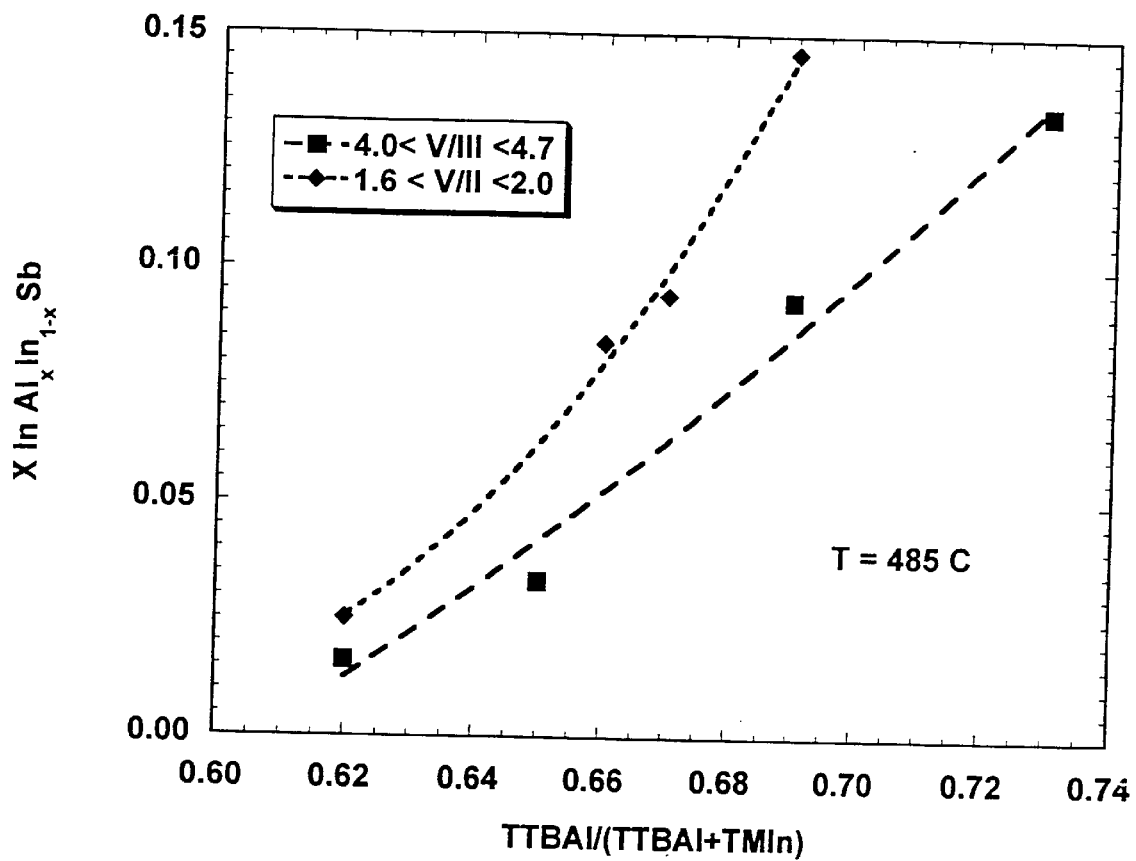
FIG. 2 shows the variation of Al as the V/III ratio varies.

FIG. 2 shows a decrease in the amount of Al in the solid as the V/III ratio increases at a growth temperature of 485° C. For a TTBAl/(TTBAl+TMIn) ratio of 0.69 the Al composition decreases from 0.15 to 0.09 for a V/III ratio increase from 1.9 to 4.1 at 485° C. This result is probably best explained by the depletion of TTBAl from the vapor phase. Through a reaction with TESbAs, as the V/III ratio (i.e., the amount of TESb) increases for a fixed TTBAl concentration, more TTBAl is depleted from the gas phase due to the pre-reaction. This increased depletion leads to lower Al incorporation in the solid. The pre-reaction should be reduced in a reactor with less mixing between the TTBAl and TESb.

Figure 3:
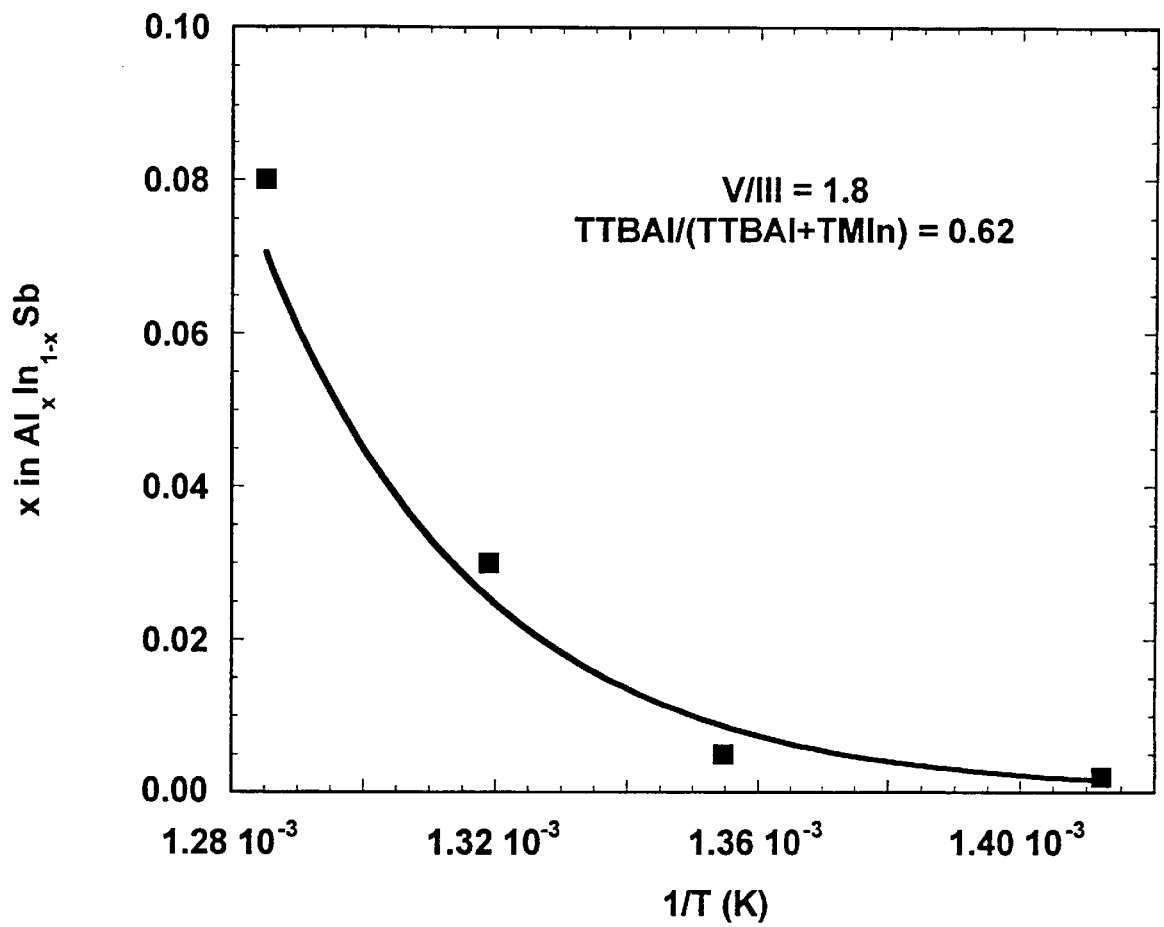
FIG. 3 shows the effect of temperature variation.

FIGS. 1 and 3 illustrate the increase in Al incorporation in solid $Al_xIn_{1-x}Sb$ for a fixed TTBAl/(TTBAl+TMIn) ratio as the temperature increases. In FIG. 1, the Al composition is seen to increase for all of the TTBAl/(TTBAI+TMIn) ratios examined. In FIG. 3, both the V/III ratio and the TTBAl/(TTBAl+TMIn) ratio were held constant as the temperature is increased from 435 to 505° C. The Al composition changes from 0.002 to 0.08 in $Al_xIn_{1-x}Sb$ as the temperature is increased. This result is best explained by an increase in the decomposition of TTBAI with temperature that is consistent with the reported pyrolysis of TTBAl as a function of temperature. However, because TESb is probably not completely decomposed at these temperatures, the V/III ratio may also be varying with temperature and, as shown above, the V/III ratio also effects the Al incorporation.

Room-temperature Hall measurements of 0.5 $\mu$m films were used to determine the carrier type and concentration of $Al_xIn_{1-x}Sb$ layers for a selection of growth conditions. For compositions of $Al_xIn_{1-x}Sb$ (x=0.13 to 0.25) and growth temperatures of 435 and 460° C., the solid was always p-type with hole concentrations between $5 \times 10^{16}$ $cm^{-3}$ to $2 \times 10^{17} cm^{-3}$ and mobilities of 24 to 91 $cm^2/Vs$ for not intentionally doped $Al_xIn_{1-x}Sb$.

The surface morphology of the $Al_xIn_{1-x}Sb$ grown on InSb substrates was found to be dependent on temperature and V/III ratio. Layer thicknesses of 0.3 to 0.6 $\mu$m were examined. The best surface morphologies were found for samples grown at low temperature and high V/III ratios. The roughest morphologies were found at higher temperature, for example at 505° C. for V/III=1.8,x=0.08, and TTBAl/(TTBAl+TMIn)=0.62. At 505° C. and for V/III ratios between 3.7 to 0.8, the morphology was always rough. For large values of x, the surface exhibited cross-hatching due to the lattice mismatch with the InSb substrate. In general, for rough morphologies, the surface got rougher for greater thicknesses. The roughness of the surface morphology was also dependent on the V/III ratio. Higher V/III ratios were generally required for smooth surfaces at lower temperatures.

As with other semiconductor materials, the $Al_xIn_{1-x}Sb$ materials produced according to the present invention can be doped by adding in gaseous compounds in the reaction chamber. To prepare p-n junctions in this material or to change its resistance, $Al_xIn_{1-x}Sb$ can be doped using conventional dopant sources. Typical dopants include diethylzinc and dimethylcadmium for p-type dopants and tetraethyltin and dimethyltellurium as n-type dopants. These and other dopants can be used provided the sources decompose at the reaction temperatures (<525° C.) and that there are no depletion reactions with the other source chemicals.

EXAMPLES

All of the following examples of the invention were carried out using a vertical, high-speed, rotating-disk reactor (RDR). TTBAI, TESb, and TMIn were the sources for Al, Sb and In, respectively. The TTBAI and TMIn reactants were kept separated from the TESb prior to injection into the RDR inlet chamber. Some mixing of the reactants occurs before they arrive at the substrate. Hydrogen was used as the carrier gas at a total flow of 31.5 slpm to maintain a matched laminar flow in the RDR. The susceptor rotation holding the substrate was 1500 rpm. A growth pressure of 200 torr was used. The following examples are merely illustrative and not limitative of the remainder of the disclosure.

Example 1

A 300 nm thick layer of $Al_{0.08}In_{0.92}Sb$ was grown at a temperature of 485° C. This layer was grown using the following hydrogen flows through the reactant's respective bubblers which are held at the given pressures and temperatures: 160 sccm of TMIn at 400 torr and 20° C.; 680 sccm of TESb at 600 torr and 19° C.; 600 sccm of TTBAl at 250 torr at 19° C. This layer was grown for 1500 seconds under these conditions. This layer had a somewhat rough surface morphology when grown on an InSb substrate. The composition was determined by x-ray diffraction.

Example 2

A 500 nm thick layer of $Al_{0.25}In_{0.75}Sb$ was grown at a temperature of 460° C. This layer was grown using the following hydrogen flows through the reactant's respective bubblers which are held at the given pressures and temperatures: 105 sccm of TMIn at 400 torr and 20° C.; 450 sccm of TESb at 250 torr and 19° C.; 600 sccm of TTBAI at 250 torr at 19° C. This layer was grown for 3809 seconds under these conditions. This layer had a slightly rough surface morphology when grown on an InSb substrate. The composition was determined by x-ray diffraction. The mobility of this not-intentionally doped layer on a GaAs substrate was 90 cm$^2$/Vs with a p-type carrier concentration of $1 \times 10^{17}$ cm$^{-3}$ and a resistivity of 0.3 Ohm-cm.

Example 3

A 580 nm thick layer of $Al_{0.07}On_{0.93}Sb$ was grown at a temperature of 435° C. This layer was grown using the following hydrogen flows through the reactant's respective bubblers which are held at the given pressures and temperatures: 105 sccm of TMIn at 400 torr and 20° C.; 550 sccm of TESb at 250 torr and 19° C.; 600 sccm of TTBAl at 250 torr at 19° C. This layer was grown for 3809 seconds under these conditions. This layer had a smooth surface morphology when grown on an InSb substrate. The composition was determined by x-ray diffraction. The mobility of this not-intentionally doped layer on a GaAs substrate was 84 cm$^2$/Vs with a p-type carrier concentration of $1 \times 10^{17}$ cm$^{-3}$ and a resistivity of 0.5 Ohm-cm.

The invention has been described in detail above and in the specific examples. Further variations will be apparent to those skilled in the art. The true scope of the invention is to be found in the appended claims.

We claim:

1. A method of producing $Al_xIn_{1-x}Sb$ crystalline materials by metal-organic chemical vapor deposition wherein an Al source material, an In source material and an Sb source material are supplied as a gas to a heated substrate in a chamber at a temperature and a pressure, said Al source material, In source material, and Sb source material having the property of decomposing at least partially above approximately 435° C. and below approximately 525° C. to produce $Al_xIn_{1-x}Sb$ crystalline materials wherein x is greater than 0.002 and less than one.

2. The method of claim 1 wherein the In source material is trimethylindium.

3. The method of claim 2 wherein the Sb source material is selected from the group consisting of triethylantimony and trimethylantimony.

4. The method of claim 2 wherein the gas has a composition of tritertiarybutylaluminum between 0.002 and 0.52 and trimethylindium between 0.001 to 0.11.

5. The method of claim 1 wherein the temperature of the chamber is greater than approximately 435° C.

6. The method of claim 1 wherein the temperature of the chamber is less than approximately 525° C.

7. The method of claim 1 wherein the pressure of the chamber is greater than approximately 80 torr.

8. The method of claim 1 wherein the substrate is selected from the group consisting of GaAs and n-type InSb.

9. The method of claim 1 wherein the Al source material, the In source material and the Sb source material each have a vapor pressure greater than 0.1 torr at a temperature greater than −10° C.

10. The method of claim 1 wherein the $Al_xIn_{1-x}Sb$ crystalline materials have hole concentrations less than approximately $2 \times 10^{17}$ cm$^{-3}$.

11. The method of claim 1 wherein the $Al_xIn_{1-x}Sb$ crystalline materials have mobilities of greater than approximately 24 cm$^2$/Vs.

12. The method of claim 11 wherein the temperature of the chamber is greater than approximately 435° C.

13. The method of claim 11 wherein the temperature of the chamber is less than approximately 525° C.

14. The method of claim 11 wherein the $Al_xIn_{1-x}Sb$ crystalline materials have hole concentrations less than approximately $2 \times 10^{17}$ cm$^{-3}$.

15. A method of producing $Al_xIn_{1-x}Sb$ crystalline materials by metal-organic chemical vapor deposition wherein tritertiarybutylaluminum, trimethylindium, and an Sb source material selected from the group consisting of trimethylantimony and triethylantimony are supplied as a gas to a heated substrate in a chamber to produce $Al_xIn_{1-x}Sb$ crystalline materials wherein x is greater than 0.002 and less than one.

* * * * *